(12) United States Patent
Fukuda et al.

(10) Patent No.: US 7,265,388 B2
(45) Date of Patent: Sep. 4, 2007

(54) SEMICONDUCTOR DEVICE

(75) Inventors: Kenji Fukuda, Tsukuba (JP); Ryouji Kosugi, Tsukuba (JP); Shinsuke Harada, Tsukuba (JP); Junji Senzaki, Tsukuba (JP); Kazutoshi Kojima, Tsukuba (JP); Satoshi Kuroda, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 73 days.

(21) Appl. No.: 10/928,269

(22) Filed: Aug. 30, 2004

(65) Prior Publication Data

US 2005/0077591 A1    Apr. 14, 2005

(30) Foreign Application Priority Data

Aug. 29, 2003    (JP)    ............................. 2003-307747

(51) Int. Cl.
*H01L 29/15*    (2006.01)
(52) U.S. Cl. .......................... 257/77; 257/76; 257/328; 257/E29.104
(58) Field of Classification Search .................. 257/76, 257/77, 328
See application file for complete search history.

(56) References Cited

U.S. PATENT DOCUMENTS

| 4,912,064 | A | | 3/1990 | Kong et al. |
|---|---|---|---|---|
| 5,011,549 | A | | 4/1991 | Kong et al. |
| 5,248,385 | A | * | 9/1993 | Powell ........................ 438/507 |
| 5,972,801 | A | * | 10/1999 | Lipkin et al. ................ 438/770 |
| 6,329,088 | B1 | | 12/2001 | Landini et al. |
| 6,573,534 | B1 | * | 6/2003 | Kumar et al. .................. 257/77 |
| 2004/0104429 | A1 | * | 6/2004 | Takahashi et al. ........... 257/338 |
| 2006/0011128 | A1 | * | 1/2006 | Ellison et al. ................. 117/84 |

OTHER PUBLICATIONS

Nakamura et al., "Surface Mechanisms in Homoepitaxial Growth on alpha-SiC {0001}-vicinal Faces;" Silicon Carbide and Related Materials; Material Science Forum; 2003; pp. 163-168.*

(Continued)

*Primary Examiner*—B. William Baumeister
*Assistant Examiner*—Matthew L. Reames
(74) *Attorney, Agent, or Firm*—Rader, Fishman & Grauer PLLC

(57) ABSTRACT

A semiconductor device formed on a silicon carbide semiconductor substrate comprises an epitaxial layer formed on a surface sloping (or inclining) by 0 to less than 1 degree from a (000-1) face of the silicon carbide semiconductor substrate, wherein at least one of a P type semiconductor area or an N type semiconductor area is selectively formed in the epitaxial layer by ion implantation, a metal electrode is formed so as to contact a surface layer of the P type semiconductor area or the N type semiconductor area, a rectification function is shown between the metal electrode and the P type semiconductor area or the N type semiconductor area, and the semiconductor device is formed on the silicon carbide semiconductor substrate of a Schottky barrier diode or a PN type diode.

18 Claims, 8 Drawing Sheets

OTHER PUBLICATIONS

Hallin et al., "Homoepitaxial on-axis growth of 4H-and 6-HSiC by CVD;" Materials Science Forum; 2004; pp. 193-196; vol. 457-460; Trans Tech Publications; Switerland.*

Kojima et al., "4H-SiC Carbon-Face Epitaxial Layers Grown by Low Pressure Hot-Wall Chemical Vapor Deposition;" Material Science Forum; 2004; pp. 209-212; vols. 457-460; Trans Tech Publications; Switerland.*

Fissel "Artificially layered heteroplytypic structure based on SiC polytypes:molecular beam epitaxy,characterization and properties" Physics Reports May 2003 Elsevier.*

Cooper, James A. et al. "Status and Prospects for SiC Power MOSFETs" IEEE Transactions on Electron Devices, vol. 49, No. 4, Apr. 2002.

Ryu, Sei-Hyung et al. "10 A 2.4 kV Power DiMOSFETs in 4H-SiC" IEEE Electron Device Letters, vol. 23, No. 6, Jun. 2002.

Spitz, J. et al. "2.6 kV 4H-SiC Lateral DMOSFET's" IEEE Electron Device Letters, vol. 19, No. 4. Apr. 1998.

Ogino, Shinji et al. "Channel Doped SiC-MOSFETs" Materials Science Forum vols. 338-342 (2000) pp. 1101-1104.

* cited by examiner

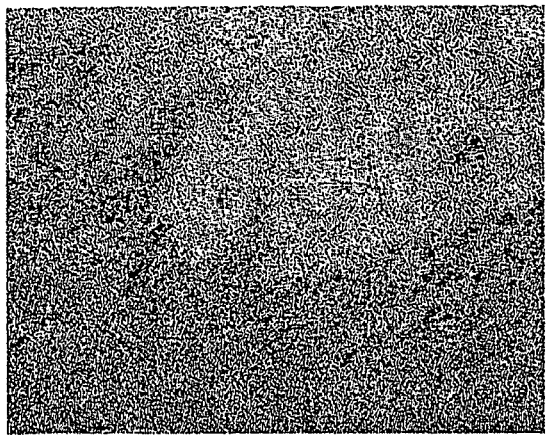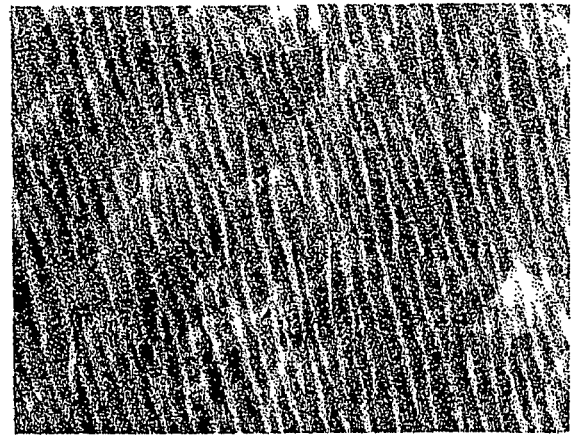
Pressure 25 mbar
FIG. 5A
Pressure 500 mbar
FIG. 5B

C/Si = 0.6

C/Si = 1.0

C/Si = 1.5

C/Si = 3.0

SEMICONDUCTOR DEVICE

TECHNICAL FIELD OF THE INVENTION

The present invention relates to a semiconductor device in which electrical properties are improved by forming the semiconductor device in an epitaxial layer on a silicon-carbide substrate whose crystal-face orientation is controlled and whose surface is treated so as to reduce fine roughness.

DESCRIPTION OF RELATED ART

Inventions as to a semiconductor device which is formed in a silicon carbide area of a semiconductor substrate of a semiconductor substrate, and a manufacturing method thereof, have been presented and disclosed as described below. In such conventional semiconductor devices in which a substrate having a silicon carbide area is used, gate electrodes are usually formed on a surface of a silicon carbide area (0001).

In general, a P-type or N-type area is formed on the (0001) face of the silicon carbide area by introducing impurities by ion implantation. After the P type or N-type impurities are introduced by the ion implantation, a heat treatment is carried out thereto at 1,500 degrees Celsius or higher for activation. In this case, it is known that silicon is evaporated from the silicon carbide surface so that fine roughness on the silicon carbide surface grows.

Consequently, leak current of a Schottky barrier diode (SBD) or a junction field effect transistor (JFET) becomes large due to growth of crystal defects in the ion implantation area or due to decrease of channel mobility of a metal-insulator film-semiconductor field effect transistor (MIS-FET) or a metal-semiconductor-field-effect-transistor (MESFET) so that practically it cannot be used.

Further, although formation of an epitaxial layer is mainly carried out on the (0001) face, in case of 6H—SiC, it must be formed on an off-angled of 3.5 degrees substrate, and in case of 4H—SiC, it must be formed on an off-angled of 8 degree substrate.

Furthermore, an epitaxial layer could not be formed on the hexagonal bulk substrate since when the epitaxial layer is formed on a just (0001) face, the degree of fault saturation of a single molecule containing Si and C becomes high so that the two dimensional core occurs and 3C—SiC which is a stable poly type at low temperature is formed.

When there is an off-angle such as 3.5 degrees or 8 degrees, the roughness of an electrode or a gate insulation film and a silicon carbide interface is large, so that there was a problem that the electrical properties of a semiconductor device are deteriorated.

Since a heat treatment for activation of impurities is carried out at a high temperature, step bunching occurs and roughness of the surface becomes large, and although channel mobility of 100 $cm^2/Vs$ or greater is required for on-resistance of 4H—SiC power MOSFET to decrease to a theoretical value, the channel mobility will not become 1 $cm^2/Vs$ or greater. For example, see J. A. Cooper, Jr., and M. R. Melloch, R. Singh, A. Agarawal, J. W. Palmour, Statusand Prospects for SiC Power MOSFETs, IEEE Transaction on electron devices, vol.49, No.4, April 2002, p.658.

Moreover, since in a DiMOSFET type SiC power MOSFET, a heat treatment is carried out at approximately 1,600 degrees Celsius after ion implantation of P type impurities (aluminum) is carried out, the channel mobility does not become greater than 22 $cm^2/Vs$ at a room temperature. See S. H. Ryu, A. Agarwal, J. Richmond, J. Palmour, N. Saks, and J. Williams, 10A, 2.4 kV Power DiMOSFETs in 4H-SiC, IEEE Electron device letters, vol.23, No.6, June 2002, p.321.

Moreover, when in a Lateral DMOSFET type SiC power MOSFET, a heat treatment for activation is carried out for 40 minutes at 1,600 degrees Celsius after ion implantation of the P type impurities (aluminum) is carried out, the channel mobility will not become greater than approximately 4 to 5 $cm^2/Vs$. See J. Spitz, M. R. Melloch, J. A. Cooper, Jr., and M. A. Capano, 2.6 kV 4H—SiC Lateral DMOSFET's, IEEE Electron device letters, vol.19, No.4, April 1998, p.100.

On the other hand, it has been reported that MOSFET was formed by using channel doping in order to introduce impurities under a gate oxide film on the (000-1) face of 6H—SiC so as to operate it. However, the structure of the device is different from that of a semiconductor device described as embodiments of the present invention, since in this device, the gate oxide film is formed by dry oxidization wherein an N-type semiconductor area is formed by ion implantation. See S. Ogino, T. Oikawa, Kueno, Channel Doped SiC-MOSFETs, Mat. Sci. Forum, 338-342 (2000), p.1101.

Moreover, U.S. Pat. No. 4,912,064 discloses that an epitaxial layer is formed on a bulk substrate which is declined by 3 degrees or greater in a direction <11-20>.

U.S. Pat. No. 5,011,549 discloses that an epitaxial layer is formed on a bulk substrate which is sloping by 1 degree or greater.

U.S. Pat. No. 6,329,088 discloses that an epitaxial layer formed on a substrate is declined by 2 degrees in a direction <1-100>.

In either case, a large slant is required so that roughness of electrodes or a gate insulation film and a silicon carbide interface becomes large, thereby deteriorating reliability of the gate insulation film and increasing leak current of the electrodes.

SUMMARY OF THE INVENTION

Thus, in these references, a semiconductor device having a P-type area and an N-type area formed by introducing impurities by ion implantation on a silicon carbide semiconductor substrate, is formed on a (0001) face. However, although in the silicon carbide substrate, there are various face orientations, there is possibility that roughness of the silicon carbide substrate surface which exists after a heat treatment for impurity activation is controlled by devising the face orientations and a method of impurity heat treatment in the face orientation, and by devising a state of the substrate before forming an epitaxial layer or a method of forming an epitaxial layer so as to improve the electrical properties of the semiconductor device.

In view of the above, an object of the present invention is to improve electrical properties of a semiconductor device by reducing roughness of a surface of a silicon carbide semiconductor substrate having a P-type and N-type impurity semiconductor area which is formed by ion implantation.

The semiconductor device according to the present invention has a semiconductor area having at least a top layer of (000-1) face made of silicon carbide, and since at least one of a P-type semiconductor area and an N-type semiconductor area is selectively formed in a silicon carbide semiconductor area by ion implantation, it is possible to reduce the roughness of the silicon carbide semiconductor area surface thereby improving the electrical properties of the semiconductor device, such as on-resistance, blocking voltage etc.

Moreover, since impurity activation heat treatment is carried out after forming the P type semiconductor area or the N type semiconductor area by ion implantation, it is possible to make the top layer of the silicon carbide semiconductor area less uneven thereby further improving the electrical properties of the semiconductor device.

The objects of the present invention is attained by a semiconductor device formed on a silicon carbide semiconductor substrate comprises an epitaxial layer formed on a sloping surface, wherein at least one of a P type semiconductor area or an N type semiconductor area is selectively formed in the epitaxial layer by ion implantation, a metal electrode is formed so as to contact a surface layer of the P type semiconductor area or the N type semiconductor area, and the semiconductor device is a Schottky barrier diode or a PN type diode which has a rectification function between the metal electrode and the P type semiconductor area or the N type semiconductor area.

The epitaxial layer may be formed on a surface sloping by 0 to less than 1 degree from the (000-1) face of silicon carbide surface.

Since the transistor in which the performance is improved is realizable, and other feature of the present invention is attained by a semiconductor device formed on a silicon carbide semiconductor substrate comprising:

an epitaxial layer formed on a surface sloping by 0 to less than 1 degree from the (000-1) face of silicon carbide substrate, wherein at least one of a P type semiconductor area and an N type semiconductor area is selectively formed in the epitaxial layer by ion implantation, a metal electrode is formed so as to contact a surface layer of the P type semiconductor area or the N type semiconductor area, the metal electrode serves as a gate electrode, a source area and a drain area are formed so that the gate electrode is disposed between the source area and the drain area, and the semiconductor device is a MES type field effect transistor or a junction field effect transistor.

In case that the angle of slope is one (1) or greater, roughness between the electrode and the silicon carbide substrate is great so that stability of the electrodes is deteriorated thereby increasing leak current. Therefore, the degree of the slope angle is preferably but not limited to 0 to less than 1.

Since a gate insulation film can be reformed by including hydrogen, still another feature of the present invention is attained by a semiconductor device formed on a silicon carbide semiconductor substrate comprising an epitaxial layer formed on a sloping surface, wherein at least one of a P type semiconductor area and an N type semiconductor area is selectively formed in the epitaxial layer by ion implantation, a gate insulation film made of a silicon oxide film is formed on a top layer of the P type semiconductor area or the N type semiconductor area, a layer of the silicon oxide film in contact with the silicon carbide semiconductor substrate is formed by oxidizing the epitaxial layer in atmosphere containing water, and hydrogen density in the gate insulation film is $1.0 \times 10^{19}$ cm$^{-3}$ or greater, and the semiconductor device has a MOS structure.

In case that the angle of slope is one (1) or greater, roughness between the gate insulation film and the silicon carbide substrate is great so that reliability of the gate insulation film is deteriorated. Therefore, the degree of the slope angle is preferably but not limited to 0 to less than 1.

The semiconductor device may further include a gate electrode, wherein the semiconductor device is a lateral MIS field effect type transistor in which a source area and a drain area is formed so that the gate electrode is disposed close to and between the source and the drain.

The semiconductor device may further include a gate insulation film and a gate electrode on a silicon carbide semiconductor area surface, wherein the semiconductor device is a vertical MIS field effect transistor, in which the source area is provided close to the gate electrode, a drain is provided on a back side of the silicon carbide semiconductor substrate, and current flowing in a c axis direction perpendicular to the surface of the epitaxial layer is controlled by changes of voltage applied to the gate electrode.

Moreover, the silicon carbide semiconductor substrate may be a P type substrate or an N type substrate.

Moreover, since the electrical properties is improved by impurity activation heat treatment, in the semiconductor device, after ion implantation of the impurities for forming a P type semiconductor area or an N type semiconductor area in the epitaxial layer is carried out, impurity activation heat treatment is carried out for 10 seconds to 10 minutes in a 1,500 to 2,000 degrees Celsius inert gas atmosphere.

In order to reduce the unsuitable impurity diffusion profile in a temperature rising process at the time of the impurity activation heat treatment, after ion implantation of impurities for forming a P type semiconductor area or an N type semiconductor area in the epitaxial layer is carried out, a heat treatment is carried out thereto within 1 minute at a temperature in a range from 1,200 degrees Celsius or less to 1,500-2,000 degrees Celsius in inert gas atmosphere and impurity activation heat treatment is carried out for a predetermined time in a range of 10 seconds to 10 minutes at a temperature in a range of 1,500 to 2,000 degrees Celsius.

Moreover, the silicon-carbide semiconductor substrate may be 4H-SiC.

Further, the epitaxial layer may be formed on the silicon carbide semiconductor substrate, and step height of a silicon carbide semiconductor substrate surface is 1 nm or less.

The electrical properties can be improved by forming the surface in which the height of a step is small. The epitaxial layer formed on the silicon carbide semiconductor substrate may be heat-treated in a mixed gas atmosphere of hydrogen gas and propane gas at a temperature in a range of 1,400-1,600 degrees Celsius so that step height of a silicon carbide semiconductor substrate surface may be 1 nm or less.

The epitaxial layer may be formed by making silane gas and propane gas react under pressure of 250 mbar (25 k Pa) or lower.

In addition, the epitaxial layer may be formed by vapor reaction of silane and propane gas in which composition ratio of atomic density of carbon (C) to that of silicon (Si) is 1 or less in atmosphere where the vapor reaction takes place.

Moreover, the semiconductor device may be applied to an electric power converter, an inverter for driving, a general purpose inverter, or a large electric power high frequency transmitter apparatus.

DESCRIPTION OF THE DRAWINGS

FIGS. 5A and 5B show an optical microscope photograph (200 times) of an epitaxial layer surface in case that the pressure was 250 mbar (25 k Pascal) and 500 mbar (50 k Pascal) respectively when the epitaxial layer is formed on a surface sloping by 0 to less than 1 degree by a chemical vapor reaction of silane and propane;

DETAILED DESCRIPTION OF THE INVENTION

Description of a manufacturing method of a Schottky barrier diode, a lateral MIS (Metal-Insulator-Semiconductor) field effect transistor, and a vertical MIS (Metal-Insulator-Semiconductor) field effect transistor will be first given below in order to describe an example of a semiconductor device formed by using a silicon carbide substrate having a (000-1) face.

Next, results obtained by measuring surface roughness of the substrate with an atomic force microscope after heat-treating the substrate in which ion implantation is carried out in the (000-1) face according to the present invention are shown.

Further, effects of pressure and C/Si ratio on surface roughness in case of forming an epitaxial layer on the surface which inclines zero (0) to less than 1 degree from the (000-1) face will be described below.

EXAMPLE 1

Figure 1:
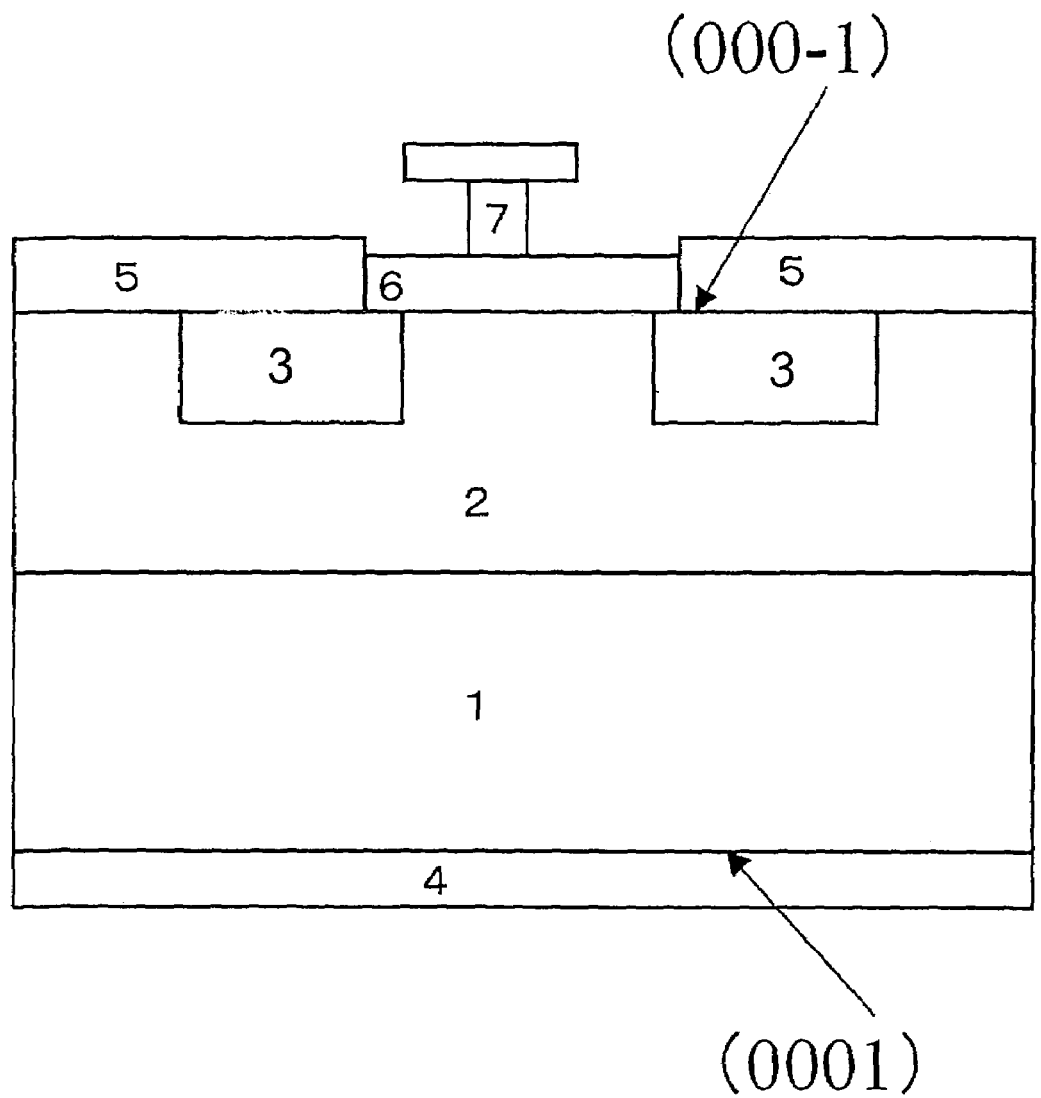
FIG. 1 is a schematic cross sectional view of a Schottky barrier diode as an example of the semiconductor device according to the present invention.

FIG. 1 is a schematic cross sectional view of a Schottky barrier diode as an example of the semiconductor device according to the present invention.

The Schottky barrier diode was prepared by a method set forth below.

(1) First, an N type epitaxial layer 2 was made to grow by 10 micrometers (μm) on the (000-1) face of an N type 4H—SiC bulk substrate 1 (resistivity: 0.002 ohm cm (Ω cm); thickness: 300 micrometers (μm)) by chemical vapor deposition (CVD) wherein nitrogen was used as impurities, and the concentration of the N type epitaxial layer 2 was $1 \times 10^{16}$ cm$^{-3}$. The bulk substrate 1 and the epitaxial layer 2 formed a silicon carbide semiconductor area, and the top layer of the epitaxial layer 2 also served as the (000-1) face.

(2) In order to form a guard ring in the circumference section of the Schottky electrode 6, $1 \times 10^{17}$ cm$^{-3}$ of P type impurities made of aluminum or boron in the area where the guard ring of the epitaxial layer 2 was to be formed, was introduced by ion implantation, so that a P type impurity area 3 for the guard ring (P type semiconductor area) was formed. At this time, as a mask for ion implantation, a silicon-dioxide film formed by low-pressure chemical vapor deposition was used. The ion implantation was carried out in a range from a room temperature to 1000 degrees Celsius after forming a hole in an area where the ion implantation of the silicon dioxide film was carried out, by hydrofluoric acid. In this example, the ion implantation is carried out at a room temperature.

(3) Subsequently, in argon atmosphere, the temperature is raised from 1,200 or less to 1,500-2,000 degrees Celsius, more preferably to 1,700 degrees Celsius, within one (1) minute, and an activation heat treatment is carried out for ten (10) seconds to ten (10) minutes. In this example, the heat treatment was carried out at 1,500 degrees Celsius for five (5) minutes.

(4) Then, after a Ni layer or Ti layer (back electrode 4) is formed on a back side (0001) face of the bulk substrate 1 by sputtering method, a back electrode 4 is formed by a heat treatment at approximately 1,000 degrees Celsius in inert atmosphere. Instead of the sputtering method, an evaporation method may be used.

(5) Next, an oxide film 5 for passivation is formed on the side of the epitaxial layer 2 in which ion implantation is carried out, an opening for forming a Schottky electrode of the oxide film 5 is formed, and then a Ni film or Ti film is formed by the sputtering method.

The Ni film or Ti film is a Schottky electrode (metal electrode) 6 which forms a Schottky junction in an area in contact with the epitaxial layer 2 to which ion implantation is carried out. Also, in this case, the evaporation method instead of the sputtering method may be used.

(6) And, a semiconductor device is completed by forming a metal wiring 7 made of an aluminum alloy by the sputtering method. Here, the evaporation method instead of the sputtering method may be used in this case.

This semiconductor device has a gate (Schottky electrode) in the (000-1) face of a silicon carbide semiconductor area, and a drain (back electrode) in a (0001) face, so as to function as a rectification circuit, wherein the direction of current flowing in the c axis direction which is a direction perpendicular to the (000-1) face is controlled by applying alternate voltage between the gate and the drain.

Thus, since the P type semiconductor area 3 is formed in the silicon carbide semiconductor areas 1 and 2 which have the top layer having the (000-1) face by introducing by ion implantation when a Schottky barrier diode is manufactured, it is possible to make fine roughness on the surface of the silicon carbide semiconductor substrate 1, and 2 small thereby improving electrical properties such as on-resistance, blocking voltage of the Schottky barrier diode, etc.

Moreover, since an impurity activation heat treatment was carried out after forming the P type semiconductor area 3 by ion implantation, it is possible to make the top layer of the silicon carbide semiconductor areas 1 and 2 less uneven thereby further improving the electric properties of the Schottky barrier diode.

Although in the above example, the present invention is applied to the Schottky barrier diode which controls a direction of current flowing in a c axis direction perpendicular to the (000-1) face, if after the P type semiconductor area 3 is formed by ion implantation in the process (2), and then the N type semiconductor area is formed by ion implantation, and further the same processes are used after that, the present invention can be applied to a PN type diode which controls direction of current following in the C axis direction which is perpendicular to the (000-1) face.

EXAMPLE 2

Figure 2:
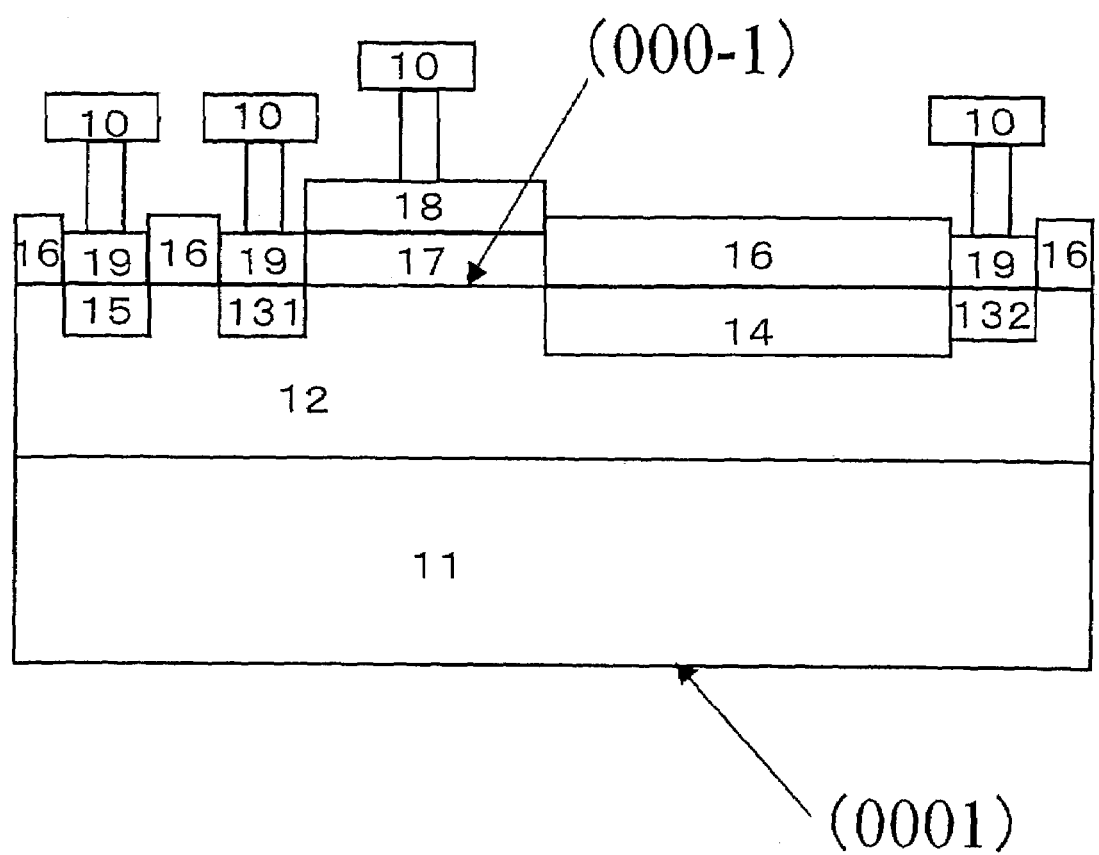
FIG. 2 is a cross sectional view of a lateral MIS electric field effect transistor as an example of semiconductor device according to the present invention.

FIG. 2 is a cross sectional view of a lateral (Lateral resurf MOS structure) semiconductor device as a lateral MIS electric field effect device according to the present invention.

First, a 10-15 micrometer P type epitaxial layer 12 was formed on the (000-1) face of a P type 4H-SiC bulk substrate 11 (resistivity: 2 ohm cm (Ω cm); thickness: 300 micrometers(μm)) by chemical vapor deposition (CVD), wherein aluminum was used as impurities. The concentration of the P type impurities was $5 \times 10^{15}$ cm$^{-3}$. In this case, the SiC bulk substrate 11 may be an N type substrate.

The bulk substrate 11 and the epitaxial layer 12 form a silicon carbide semiconductor area, and the top layer of the epitaxial layer 12 also serves as the (000-1) face.

(2) Subsequently, an ion implantation mask for forming source areas and drain areas is formed with a thermally-oxidized film or SiO2 film by CVD (Chemical Vapor Deposition).

In this example, a LTO (Low Temperature Oxide) film was used as the ion implantation mask. The LTO film was formed by making a silane and oxygen react at 400 to 800 degrees Celsius, thereby depositing a silicon dioxide.

(3) Then, after the source area and drain area are formed by photolithography, an opening is formed in the source area and the drain area where ion implantation was carried out by etching the LTO film with HF (hydrofluoric acid), and ion implantation of nitrogen, phosphorus, or arsenic was carried out in the opening at 500 degrees Celsius so as to form an N type impurity area which serve as a source 131 and a drain 132.

(4) Subsequently, an N type impurity area 14 for voltage proof is formed in the same way as that of the ion implantation of the source 131 and the drain 132. This layer may be divided into two or more areas and the concentration may be gotten higher as getting close to the drain from the gate. Moreover, in order to acquire ohmic contact with the P type epitaxial layer 12, the drain 132 and the N-type impurity area 14, after forming an ion implantation mask, ion implantation of aluminum or boron is carried out so as to form P+ type impurity area 15 as in the cases of the source 131.

In the above description, "−" of "N− type" represents low concentration which is lower than that of N type impurities of the N type area and "+" of "P+ type" represents high concentration which is higher than that of P type impurities of P type area.

(5) After that, in argon atmosphere, a heat treatment was performed for 5 minutes at 1500 degrees Celsius so as to carry out an impurity activation heat treatment. This temperature can be chosen from the range of 1,500 to 2,000 degrees Celsius, and that time for the treatment can be chosen from the range of 10 seconds to 10 minutes. Further, after that, it was cooled down to the temperature of 1200 degrees Celsius or less for 1 minute.

The time for cooling can be chosen from the range of 1 to 5 minutes. In this case, it is still better to raise the temperature within 1 minute from 1,200 degrees Celsius or less to the heat treatment temperature.

(6) Then, a SiO$_2$ film 16 for passivation is formed on the epitaxial layer 12 by a thermally-oxidized film or a LTO film. In this example, it was formed by the LTO film.

(7) A opening portion for forming a gate insulation film is formed, and further it is oxidized by O$_2$ gas or O$_2$ gas including H$_2$O (water) at 800 to 1,200 degrees Celsius so as to form an approximately 50 nm gate insulation film 17. The gate insulation film 17 is formed by thermally oxidizing silicon carbide in the layer which is as a whole or at least partially in contact with the epitaxial layer 12. In case that thermal oxidization is carried out in O$_2$ gas atmosphere including water, hydrogen is included in the formed gate insulation film.

(8) On the gate insulation film 17, a gate electrode (metal electrode) 18 was formed. This gate electrode 18 may be formed using any of aluminum, and N type or P type polysilicon. In addition, the gate insulation film 17 and the gate electrode 18 are called "gates" hereinafter.

(9) Etching of the SiO$_2$ film 16 on the source 131 and the drain 132 is continuously carried out in order to form a contact hole.

(10) Subsequently, after forming nickel, titanium, metal containing aluminum, or laminating film thereof was formed by deposition or the sputtering method, a contact electrode (metal electrode) 19 was formed by reactive ion etching (RIE) or wet chemical etching, and an ohmic contact was made by heat-treatment at approximately 1,000 degrees Celsius in inert gas atmosphere.

(11) Finally, metal wirings 10 are formed by the RIE or the wet chemical etching after forming metal containing aluminum by deposition or the sputtering method.

EXAMPLE 3

Figure 3:
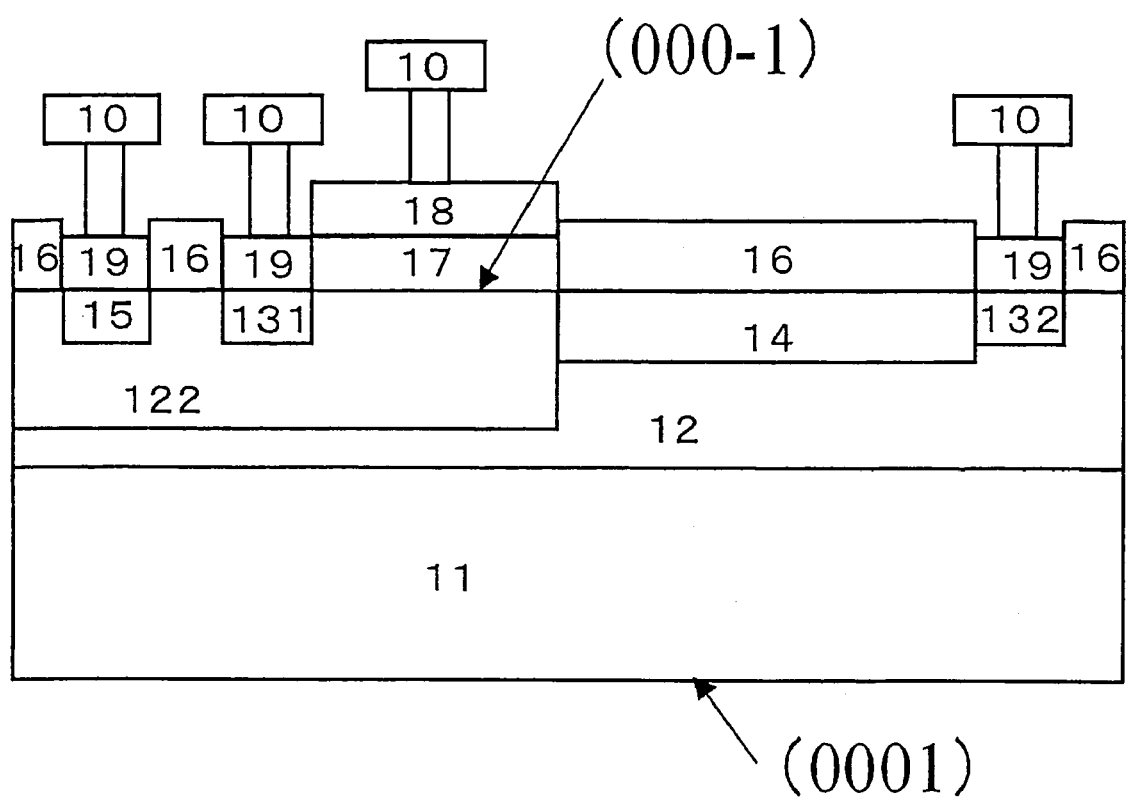
FIG. 3 is a cross sectional view of a lateral MIS electric field effect transistor according to the present invention as an example of semiconductor device.

FIG. 3 is a cross sectional view of a lateral (Lateral resurf MOS structure) semiconductor device whose structure is different from that shown in FIG. 2 as an example of a lateral MIS electric field effect transistor according to the present invention.

Although the structure of the semiconductor device shown in FIG. 3 is basically the same as that shown in FIG. 2, they are different in terms that a P type impurity area 122 is formed on an epitaxial layer 12, and a source 131 and P+ type impurity area 15 are formed on the epitaxial layer 12.

The lateral Lateral resurf MOSFET semiconductor device shown in FIGS. 2 and 3 has a gate (comprising a gate insulation film and a gate electrode), a source, and a drain in the (000-1) face of a silicon-carbide semiconductor area, which is a switching element wherein on/off of current which flows in the (000-1) face between the source and the drain, is controlled by impressing voltage to the gate.

In addition, as an example of the lateral semiconductor device, there is a MES type field effect transistor. Although the MES type field effect transistor is the same as lateral Lateral resurf MOSFET semiconductor device in terms that it has a gate, a source, and a drain in the (000-1) face of a silicon-carbide semiconductor area, wherein on/off of current which flows in the (000-1) face is controlled by applying voltage to the gate, there is no gate insulation film under the gate electrode, and the gate electrode made of metal is directly formed on the silicon-carbide semiconductor.

Since in case that the lateral semiconductor device is manufactured, the source 131, the drain 132, the P− type semiconductor area and the N type semiconductor area such as the P+ type impurity area 15 and the N− type impurity area 14 are formed on the silicon-carbide semiconductor areas 11 and 12 which have a top layer (000-1) face by ion implantation, fine roughness on the surface of the silicon-carbide semiconductor substrate 11 and 12 can be made smaller than that of the (0001) face, thereby improving the electrical properties, such as on-resistance of the lateral semiconductor device and blocking voltage.

Moreover, since, after forming the source 131, the drain 132, the N-type impurity area 14, the P type semiconductor area such as the P$^+$ type impurity area 15, or the N type semiconductor area by ion implantation, it is heated to the temperature of 1500 to 2000 degrees Celsius or less in order to carry out impurity activation heat treatment for 10 minutes at the temperature, and further, it is heated from 1,200 degrees Celsius or lower to the temperature of 1500 to 2000 degrees Celsius for 1 minute or less in an inert atmosphere wherein an impurity activation heat treatment is carried out 10 seconds to 10 minutes, so that the top layer surface of the silicon-carbide semiconductor areas 11 and 12 can be changed into a less uneven surface thereby improving electrical properties of the lateral semiconductor device.

Figure 4:
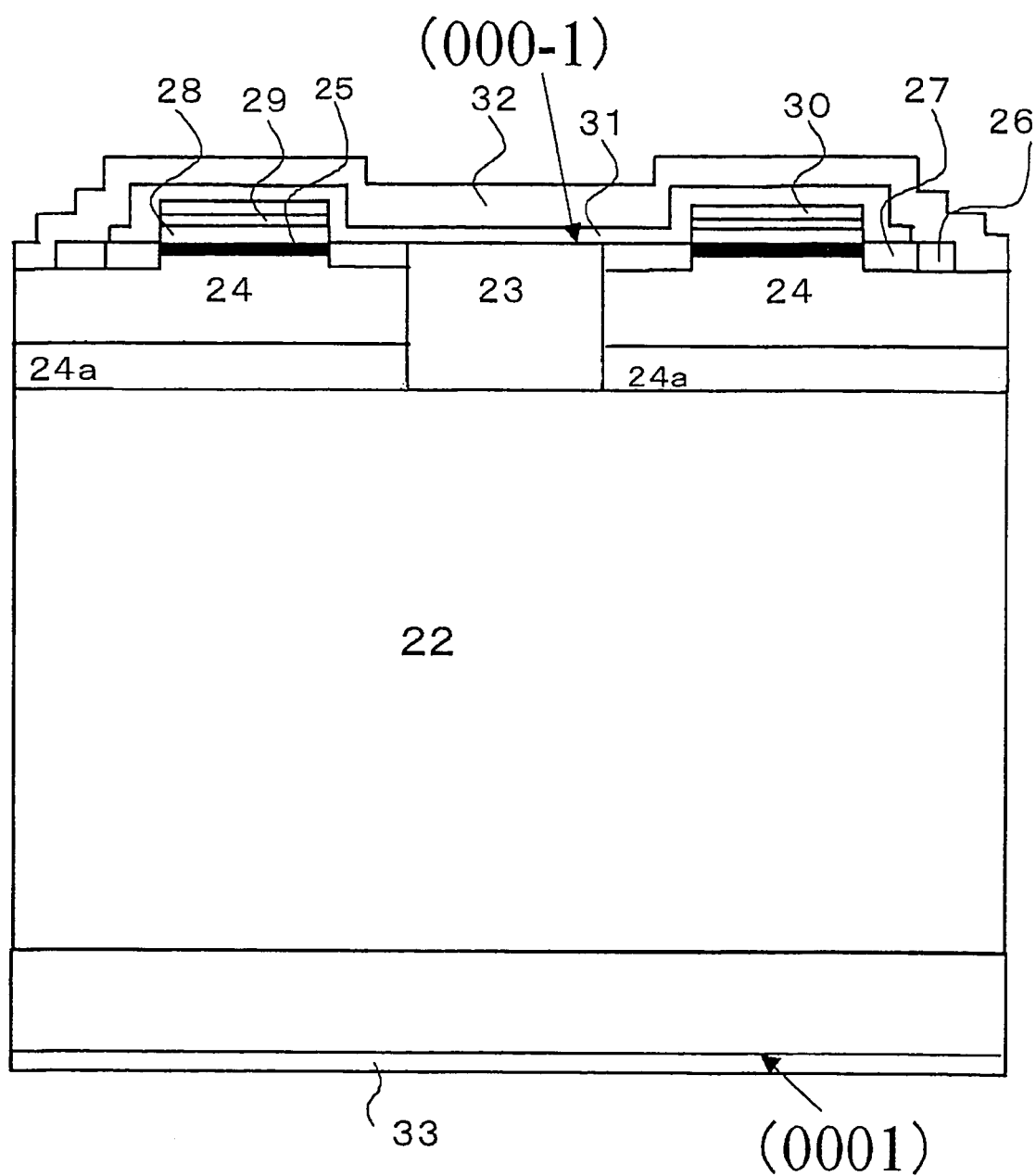
FIG. 4 is a schematic cross sectional view of a vertical MIS field effect transistor as an example of the semiconductor device according to the present invention.

FIG. 4 is a schematic cross sectional view of a vertical MIS field effect transistor as an example of the semiconductor device according to the present invention. In the semiconductor device according to the present invention:

(1) a bulk substrate 21 was formed by high concentration N type 4H—SiC substrate, and the epitaxial layer 22 made of a low-concentration N type silicon carbide was formed on the (000-1) face. The bulk substrate 21 and the epitaxial layer 22 formed a silicon-carbide semiconductor area, and the top surface of the epitaxial layer 22 also served as a (000-1) face.

(2) Next, epitaxial growth of a first N type impurity area 23 which had a first concentration and made of a silicon carbide on the epitaxial layer 22 was carried out by the Chemical Vapor Deposition. Then, after carrying out the conventional RCA washing for the substrate made of a silicon carbide in this stage, the alignment mark for lithography was formed by RIE (Reactive ion etching).

(3) And, an LTO (Low temperature oxide) film was used for a mask for ion implantation.

This LTO film was formed by making a silane and oxygen react at 400-800 degrees Celsius, and depositing a silicon dioxide on a silicon-carbide substrate (the first N type impurity area 23). The temperature can be selected from a range of 400-800 degrees Celsius.

(4) Subsequently, after forming the area where ion implantation was carried out by the lithography, a hole was formed in the area for ion implantation by etching the LTO film using HF (hydrofluoric acid).

(5) Subsequently, on the first N type impurity area 23, the first P type silicon carbide areas (P type (P–) well) 24, 24 adjoining both the sides of the first N type impurity area 23 was formed by carrying out the ion implantation of aluminum or boron.

(6) Moreover, a second P type silicon carbide areas (P+ area) 24a, 24a whose concentration was higher than that of the first P type silicon carbide area 24 was formed under the first P type silicon carbide area 24 by ion implantation in order to increase blocking voltage. It was found that when the second P type silicon carbide areas 24a, 24a were formed by carrying out ion implantation of aluminum or boron of $10^{18}$ cm$^{-3}$ to $10^{19}$ cm$^{-3}$, it is possible to reliably improve pressure tightness.

(7) Furthermore, as an N type impurity area having sufficient impurity concentration, a buried channel area 25 is selectively formed, according to need, from a surface of the first P type silicon carbide area 24 under an area where a gate oxide film is to be formed, to the inside. The formation of the buried channel area 25 was performed in depth ($L_{bc}$) of 0.3 µm(micrometers) by the ion implantation of $1 \times 10^{15}$ cm$^{-3}$ to $5 \times 10^{17}$ cm$^{-3}$. And multi-stage implantation of phosphorus was carried out so that the total dose amount of phosphorus was set to $7 \times 10^{15}$ cm$^{-2}$, and it was formed in the desired depth by controlling implantation energy in the range of 40 keV to 250 keV.

(8) Next, in a position different from the first N type impurity area 23, a second N type impurity area (N+ source) 26, 26 of the second concentration is selectively formed from the surface of the first P type silicon carbide area 24, 24 to the inside.

(9) Further, according to need, a third N type impurity area 27 of the third concentration was selectively formed from the surface to the inside in the first P type silicon carbide area 24 between the second N type impurity area 26 and the buried channel area 25.

(10) After that, in the range of temperature of 1,500-2,000 degrees Celsius, in argon atmosphere, an impurity activation heat treatment was performed for 10 seconds to 10 minutes, and then it was cooled down to the temperature of 1,200 degrees Celsius or less for 1 to 5 minutes. In this example, a heat treatment was carried out at 1,500 degrees Celsius for 5 minutes. At this time, it is still better to raise the temperature within 1 minute from 1,200 degrees Celsius or less to the heat treatment temperature.

(11) Subsequently, it was oxidized in $O_2$ atmosphere or $O_2$ atmosphere containing $H_2O$ at 1200 degrees Celsius so as to form about 50 nm gate oxide films 28, 28. This gate insulation film 28 was formed by thermal oxidization of the entire gate insulation film 28 or at least a layer in contact with the epitaxial layer 22. In case that the thermal oxidization was carried out in atmosphere of $O_2$ containing water, the formed gate insulation film contains hydrogen.

Figure 8:
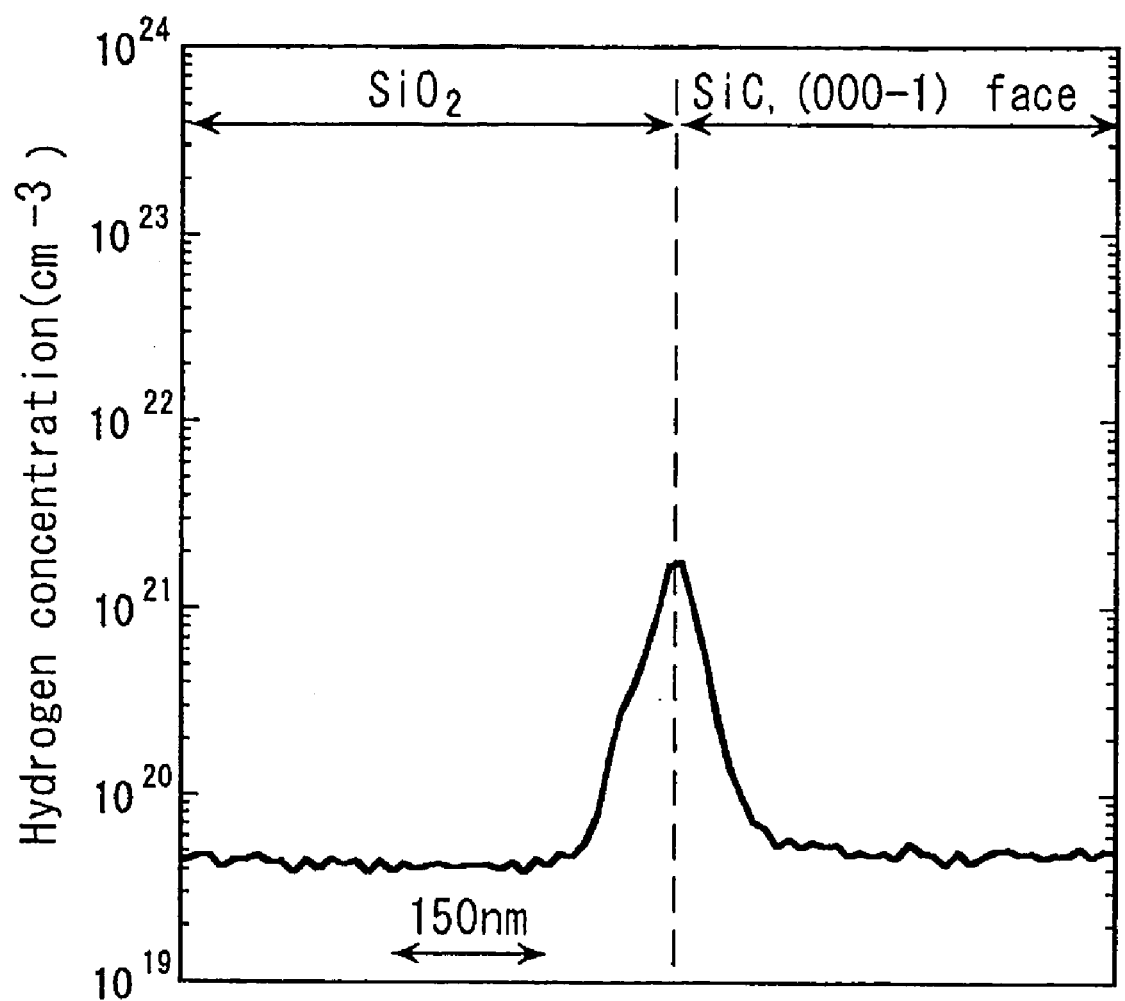
FIG. 8 shows actual measurement values of hydrogen density near gate oxide film measured by a SIMS (secondary ion mass spectrometry).

FIG. 8 shows actual measurement values measured by a SIMS (static secondary ion mass spectrometry). It turns out that hydrogen is centrally distributed to an interface between a silicon carbide substrate and the thermally-oxidized gate film. If the maximum value is $1.0 \times 10^{19}$ cm$^{-3}$ or greater in the interface, the mobility will be improved.

(12) Then, after annealing for 30 minutes in argon, it was cooled down to room temperature in argon.

(13) After that, the gate electrodes 29, 29 were formed. The gate electrodes 29, 29 are made of P+ polysilicon.

There are many methods for forming P$^+$polysilicon electrodes, for example:

(a) After polycrystal polysilicon is formed by a CVD method (Chemical Vapor Deposition), ion implantation of boron or boron fluoride is carried out so as to form P type polycrystal silicon;

(b) After the polycrystal silicon is formed by the CVD method, a $SiO_2$ film containing boron is formed by the CVD method or a spin-on coating method and diffused by carrying out a heat treatment at 800 to 1,100 degrees Celsius so as to form the P type polycrystal silicon by implanting boron;

(c) Boron is implanted in polycrystal silicon by flowing silane and diborane together and heating at 600 degrees Celsius so as to form P type polycrystal silicon etc.

In this embodiment, the method (b) was used.

(14) and formation of the gate electrodes 29, 29 was completed by etching. In addition, although the gate electrodes 29 were made of P+ polysilicon as in the above explanation, aluminum, aluminum alloy, or molybdenum metal may be used. The interface with the gate oxidized film 28 in case that the gate electrode 29 was made of aluminum, aluminum alloy, or molybdenum metal, was better than the interface with the gate oxidized film of the case that the gate electrode 29 was made of polysilicon, and further the channel mobility of the former case was higher than that of the later case.

Moreover, a silicide film 30 made of any one of $WSi_2$, $MoSi_2$, and $TiSi_2$ may be formed on these gate electrodes 29, 29.

(15) After depositing an interlayer insulation film 31 by the CVD method succeedingly, contact holes were formed by etching in the interlayer insulation film 31 on the second N type impurity area (N⁺ source) 26, 26 and the first P type silicon carbide area (P-well) 24, 24.

(16) Subsequently, after forming metal containing nickel, titanium, aluminum, or a laminating film made of alloy thereof was formed by deposition or a sputtering method.

(17) After that, metal wiring 32 made of polycrystal silicon was formed by RIE or wet etching, and the first P type silicon carbide area 24 and the second N type impurity area 26 were shorted together. In this example, after aluminum was deposited, the metal wiring 32 was formed.

(18) Subsequently, the drain electrode 33 was formed in the back side of the bulk substrate 21 by attaching metal in required thickness by the depositing method or the sputtering method. In this example, nickel was attached by the sputtering method.

(19) Moreover, if needed, a heat treatment was performed in 1000-degree Celsius argon for 5 minutes, so as to complete a vertical MIS field effect transistor was completed.

As a vertical semiconductor device other than the above device, there was a junction field effect transistor. This transistor does not have an oxide film under a gate electrode, and has a structure formed so that a metal gate electrode is directly in contact with a silicon carbide. on/off of current which flows in the direction perpendicular to the (000-1) face is controlled by applying voltage to the gate electrode.

Thus, since when a vertical MIS field effect transistor or a junction field effect transistor are manufactured, in the silicon-carbide semiconductor substrate (silicon-carbide semiconductor area) 21, 22 in which the top layer has a (000-1) face, a P type semiconductor area or N type semiconductor area such as the first N type silicon carbide area 23, the first P type silicon carbide 24, the second P type silicon carbide area 24a etc. are formed by ion implantation, it is possible to make the roughness of the surface of the silicon carbide semiconductor substrates 21, 22 smaller than that of the (0001) face, thereby reducing on-resistance of the vertical MIS field effect transistor and the junction field effect transistor to approximately tenth.

Moreover, since an impurity activation heat treatment was carried out after the P type semiconductor area or N type semiconductor area such as the first N type silicon carbide area 23, the first P type silicon carbide area 24 and the second P type silicon carbide area 24a etc., were formed by ion implantation, it is possible to make it less uneven than that of the top layer of the silicon carbide semiconductor substrate 21, 22, thereby further improving the electrical properties of the vertical MIS field effect transistor and the junction field effect transistor.

The electrical properties of the semiconductor device of the present invention explained above, such as, a Schottky barrier diode, a PN type diode, a junction field effect transistor, a lateral MIS field effect transistor, and a vertical MIS field effect transistor, are improved thereby contributing to improvement of performance of the apparatus such as a power converter, an inverter for driving, a general purpose inverter. In case of a MES type field effect transistor, it contributes to the performance improvement of a G Hz band large power high frequency communication device in which the MES type field effect transistor is installed.

Figure 7:
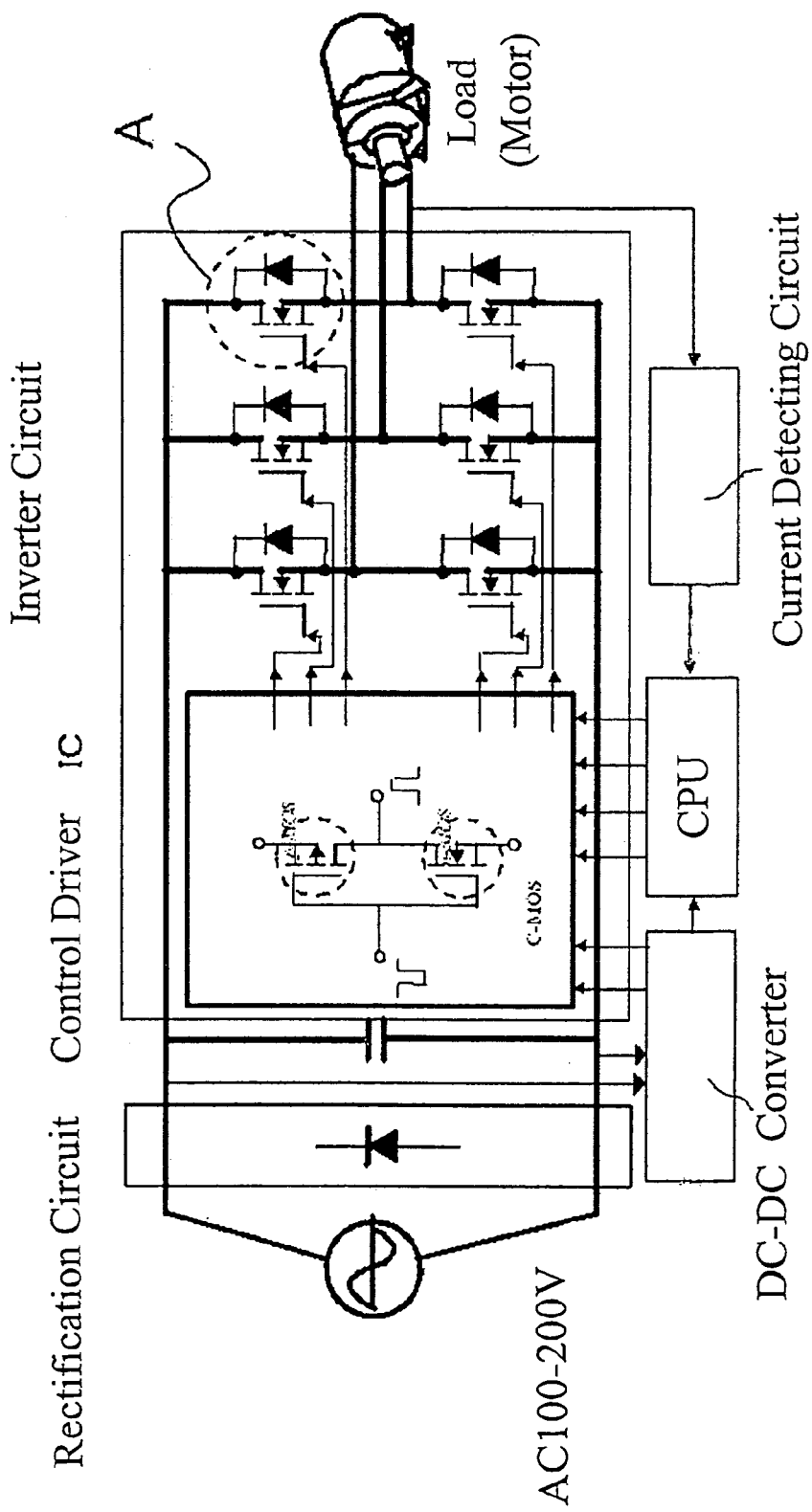
FIG. 7 shows a circuit diagram in which the lateral MIS field effect transistor is applied to an inverter for driving wherein the transistor is disposed in a position A shown in FIG. 7.

FIG. 7 shows a circuit diagram in which the lateral MIS field effect transistor is applied to an inverter for driving wherein the transistor is disposed in a position A shown in FIG. 7.

Next, the effects of heat treatment time to the surface roughness (RMS) of the (0001) face and the (000-1) face of a silicon carbide semiconductor substrate and a (000-1) face is explained.

In order to examine the effects of the activation heat treatment to the surface roughness, the silicon carbide substrate of a (0001) face and the silicon carbide substrate of (000-1) face were heated for 1 minute from room temperature to 1600 degrees Celsius, and a 1 minute activation heat treatment and a 10 minute activation heat treatment were performed respectively, and then the surface was observed with an atomic force microscope so as to measure the surface roughness (RMS) was measured. The result is shown in Table 1. As shown in Table 1, without regard to the heat treatment time, such as 1 minute and 10 minutes, the surface roughness (RMS) of the (000-1) face is smaller than that of the (0001) face approximately half.

TABLE 1

|  | 1 minute | 10 minutes |
|---|---|---|
| (0001) face | 0.7 nm | 1.5 nm |
| (000-1) face | 0.4 nm | 0.6 nm |

When, by forming, in the (000-1) face, the semiconductor device which has an ion implantation area, a gate insulation film or gate electrodes are formed thereon so as to prepare semiconductor device such as a lateral MIS field effect transistor, a vertical MIS field effect transistor, a MES type field effect transistor or a junction field effect transistor etc., when electrons flow in on-stage, scattering is reduced due to roughness of the silicon carbide substrate surface so that the electrons flow well thereby reducing on-resistance thereof. In addition, high-frequency property of the MES type field effect transistor is improved.

Moreover, since when a junction portion is formed by a lateral MIS field effect transistor, vertical MIS field effect transistor, a MES type field effect transistor, a junction type field effect transistor, a Schottky barrier diode, and a PN type diode, crystal defects are difficult to be created, when in an opposite, direction, (negative) voltage is applied to the gate electrodes, leak current is reduced and at the same time, voltage proof is improved.

FIGS. 5A and 5B show an optical microscope photograph (200 times) of an epitaxial layer surface in which the pressure was 250 mbar (25 k Pascal) and 500 mbar (50 k Pascal) respectively even when the epitaxial layer is formed on a surface sloping by 0 to less than 1 degree by a chemical vapor reaction of silane and propane gas. Although in case of the pressure of 500 mbar, the surface is uneven, in case of the pressure of 250 mbar, the surface is smooth. Therefore, by forming the epitaxial layer under the pressure of 250 mbar or less, even though the surface is sloping by 0 to less than 1 degrees, it is possible to form a smooth epitaxial layer so that a semiconductor device having electrodes or a gate insulation film on such an epitaxial layer shows excellent electrical properties.

Figure 6A:
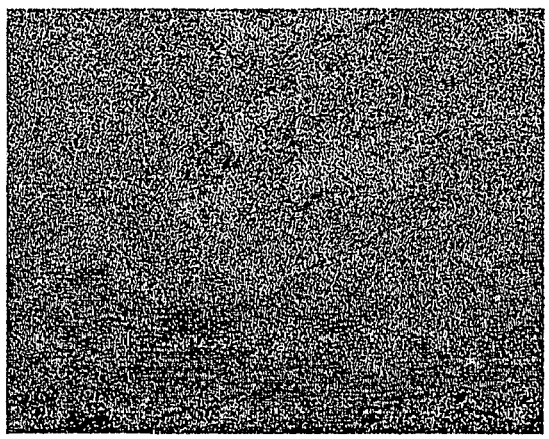
FIGS. 6A, 6B, 6C and 6D show an optical microscope photograph (200 times) of an epitaxial layer surface in case that the atomic number ratio of C and Si is 0.6, 1, 1.5 and 3 respectively when the epitaxial layer is formed on a surface sloping by 0 to less than 1 degree by a chemical vapor reaction of silane and propane gas.
Figure 6B:
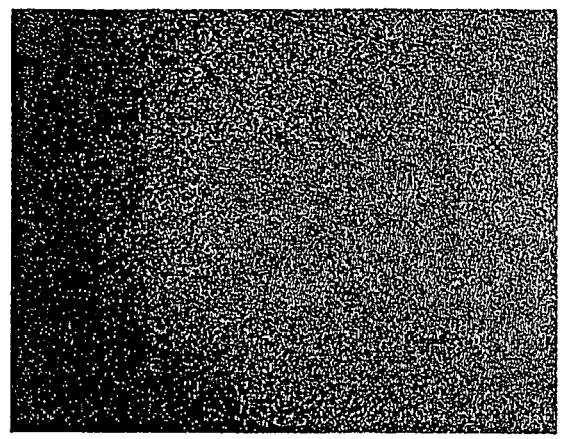
Figure 6C:
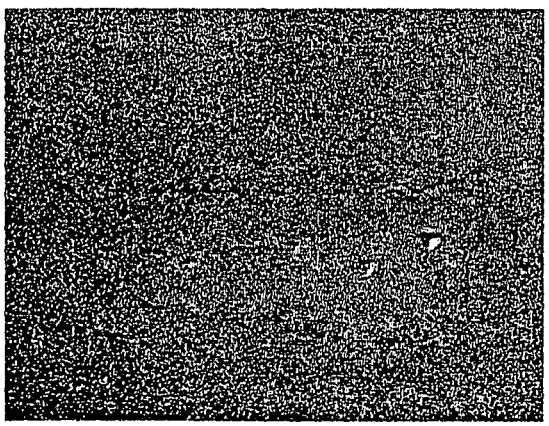
Figure 6D:
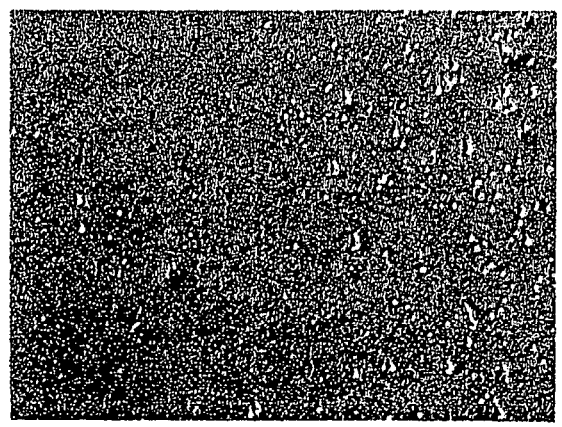

Moreover, FIGS. 6A, 6B, 6C and 6D show an optical microscope photograph (200 times) of an epitaxial layer surface in which the atomic number ratio of C and Si is 0.6, 1, 1.5 and 3 respectively when the epitaxial layer is formed on a surface sloping by 0 to less than 1 degree by a chemical vapor reaction of silane and propane gas. FIG. 6C shows a photograph in case of C/Si=1.5 wherein a lot of triangle shape defects exist. FIG. 6D shows a photograph in case of C/Si=3, wherein the large number of defects exist. On the other hand FIGS. 6A and 6B show a photograph in case of C/Si=0.6 and 1.0 respectively wherein defects are not observed and the surface is smooth respectively. Therefore, by forming the epitaxial layer in a condition that C/Si is 1.0 or less, it is possible to form a smooth epitaxial layer even though the (000-1) face is sloping by less than 1 degree, so that it is possible to obtain excellent electrical properties in the semiconductor device in which electrodes or gate insulation film is formed on such an epitaxial layer.

As described above, since the semiconductor device according to the present invention, has a semiconductor area in which at least the top layer has silicon carbide (000-1) face, and at least one of a P type semiconductor area and N type semiconductor area is selectively formed in the silicon carbide semiconductor area by ion implantation, it is possible to reduce roughness of the silicon carbide semiconductor area surface thereby improving electrical properties of the semiconductor device such as on-resistance and blocking voltage etc.

Moreover, since an impurity activation heat treatment is carried out after forming a P type semiconductor area and/or an N type semiconductor area by ion implantation, it is possible to make the top layer of the silicon carbide semiconductor area more smooth thereby further improving electric properties of the semiconductor device.

Thus the present invention possesses a number of advantages or purposes, and there is no requirement that every claim directed to that invention be limited to encompass all of them.

The disclosure of Japanese Patent Application No. 2003-307747 filed on Aug. 29, 2003 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor device formed on a silicon carbide film on a silicon carbide semiconductor substrate comprising:
   a substrate of 4H type silicon carbide semiconductor with a surface inclined by 0 to less than 1 degree from a (000-1) crystal surface;
   a homo-epitaxially grown crystal film with a roughness less than 1 nm formed on the substrate; and
   a P type semiconductor area or an N type semiconductor area which is selectively formed in the homo-epitaxially grown crystal film using ion implantation.

2. The semiconductor device according to claim 1, wherein:
   the silicon carbide semiconductor substrate is a P type substrate or an N type substrate.

3. The semiconductor device according to claim 1, wherein:
   after ion implantation of the impurities for forming a P type semiconductor area or an N type semiconductor area in the epitaxial layer, is carried out, impurity activation heat treatment is carried out for 10 seconds to 10 minutes in a 1,500 to 2,000 degrees Celsius inert gas atmosphere.

4. The semiconductor device according to claim 1, wherein:
   after ion implantation of impurities for forming a P type semiconductor area or an N type semiconductor area in the epitaxial layer is carried out, a heat treatment is carried out thereto within 1 minute at a temperature in a range from 1,200 degrees Celsius or less to 1,500-2,000 degrees Celsius in inert gas atmosphere and impurity activation heat treatment is carried out for a predetermined time in a range of 10 seconds to 10 minutes at a temperature in a range of 1,500 to 2,000 degrees Celsius.

5. The semiconductor device according to claim 1, wherein:
   the epitaxial layer is formed on the silicon carbide semiconductor substrate, and
   step height of a silicon carbide semiconductor substrate surface is 1 nm or less.

6. The semiconductor device according to claim 1, wherein:
   the epitaxial layer formed on the silicon carbide semiconductor substrate is heat-treated in a mixed gas atmosphere of hydrogen gas and propane gas at a temperature in a range of 1,400-1,600 degrees Celsius so that step height of a silicon carbide semiconductor substrate surface is 1 nm or less.

7. The semiconductor device according to claim 1, wherein:
   the epitaxial layer is formed by making silane gas and propane gas react under pressure of 250 mbar (25 k Pa) or lower.

8. The semiconductor device according to claim 1, wherein:
   the epitaxial layer is formed by vapor reaction of silane and propane gas in which composition ratio of atomic density of carbon (C) to that of silicon (Si) is 1 or less in atmosphere where the vapor reaction takes place.

9. An electric power converter comprising the semiconductor device according to claim 1.

10. An inverter for driving comprising the semiconductor device according to claim 1.

11. A general purpose inverter comprising the semiconductor device according to claim 1.

12. A large power high frequency communication device comprising the semiconductor device according to claim 1.

13. The semiconductor device according to claim 1, further comprising:
   a gate insulation film made of a silicon oxide film being formed on a top layer of the P type semiconductor area or the N type semiconductor area, a layer of the silicon oxide film in contact with the silicon carbide semiconductor substrate is formed by oxidizing the epitaxial layer in atmosphere containing water,
   hydrogen density in the gate insulation film being $1.0 \times 10^{19}$ cm$^{-3}$ or greater, and the semiconductor device has a MOS structure.

14. The semiconductor device according to claim 13, further comprising:
- a gate insulation film and a gate electrode on a silicon carbide semiconductor area surface,
- wherein the semiconductor device is a vertical MIS field effect transistor, in which:
- the source area is provided close to the gate electrode,
- a drain is provided on a back side of the silicon carbide semiconductor substrate, and
- current flowing in a c axis direction perpendicular to the surface of the epitaxial layer is controlled by changes of voltage applied to the gate electrode.

15. The semiconductor device according to claim 13, further comprising:
- a gate electrode,
- wherein the semiconductor device is a lateral MIS field effect type transistor in which a source area and a drain area is formed so that the gate electrode is disposed close to and between the source and the drain.

16. The semiconductor device according to claim 1, further comprising:
- a metal electrode formed so as to contact a surface layer of the P type semiconductor area or the N type semiconductor area,
- the semiconductor device being a Schottky barrier diode or a PN type diode which has a rectification function between the metal electrode and the P type semiconductor area or the N type semiconductor area.

17. The semiconductor device according to claim 1, further comprising:
- a metal electrode formed so as to contact a surface layer of the P type semiconductor area or the N type semiconductor area,
- the metal electrode serving as a gate electrode, and a source area and a drain area are formed so that the gate electrode is disposed between the source area and the drain area, and
- the semiconductor device is a MES type field effect transistor or a junction field effect transistor.

18. A semiconductor device formed on a silicon carbide film on a silicon carbide semiconductor substrate comprising:
- a substrate of 4H type silicon carbide semiconductor with a surface inclined by 0 to less than 1 degree from a (000-1) crystal surface;
- a homo-epitaxially grown crystal film formed on the substrate and smoothened to a roughness less than 1 um by a heat treatment process in an atmosphere of a mixed gas of hydrogen gas and propane gas at a temperature in a range of 1400 to 1600 Celsius; and
- a P type semiconductor area or an N type semiconductor area which is selectively formed in the homo-epitaxially grown crystal film using ion implantation.

* * * * *